United States Patent [19]

Heitzmann

[11] Patent Number: 4,502,023
[45] Date of Patent: Feb. 26, 1985

[54] METHOD OF FABRICATING A VARACTOR/OSCILLATOR DIODE MODULE FOR A TUNABLE OSCILLATOR

[75] Inventor: Michel Heitzmann, Paris, France
[73] Assignee: Thomson-CSF, Paris, France
[21] Appl. No.: 388,157
[22] Filed: Jun. 14, 1982
[30] Foreign Application Priority Data Jun. 19, 1981 [FR] France ................ 81 12145

[51] Int. Cl.³ .................... H01L 23/32; H03B 7/14
[52] U.S. Cl. ................... 331/107 R; 331/107 DP;
  331/107 C; 331/177 V; 333/250; 333/253;
  357/76
[58] Field of Search .......... 331/96, 107 R, 107 DP,
  331/107 C, 177 V; 333/231, 247, 250, 253, 263;
  357/75, 76

[56] References Cited

U.S. PATENT DOCUMENTS 3,320,497  5/1967  Neuf ..................... 357/76 X
3,638,143  1/1972  Higashi et al. ............. 331/177 VX
4,048,589  9/1977  Knox et al. ................ 331/96 X

FOREIGN PATENT DOCUMENTS 0005096  10/1979  European Pat. Off. .
2133494  12/1972  France .
2231109  12/1974  France .

OTHER PUBLICATIONS

Weller et al., "Tunable Millimeter-Wave Packaged IMPATT Diode Oscillators", Conference: *Microwave Symposium Digest of Technical Papers, IEEE*, Atlanta, Ga., 12-14 Jun. 1974, pp. 320-322, 331-107 DP.
*Nachrichten Elektronik*, vol. 34, No. 1, Jan. 1980, Heidelberg (de) K. Schunemann: "Prinzipien der Leistungs-Addition aus Halbleiter-Elementen", pp. 5-9.
*IEEE Transactions on Microwave Theory and Techniques*, vol. MTT-27, No. 5, May 1979, New York (U.S.), T. Midford et al.: "Millimeter-Wave CW IMPATT Diodes and Oscillators", pp. 483-492.

*Primary Examiner*—Siegfried H. Grimm

[57] ABSTRACT

In a method of fabrication of a module formed by a semiconductor diode which oscillates in millimeter waves and by a variable-capacitance diode, the oscillating diode is mounted on a pedestal at the center of a support base. A ring of fused silica for supporting a metallic disk of predetermined diameter serves to form a radial space between two metallic surfaces with a view to readily obtaining oscillation in a predetermined frequency band. A similar ring is welded at one end to the opposite face of the disk and at the other end to another metallic base fitted with a central variable-capacitance diode. Flexible connections bonded to the diodes are clamped between the rings and the disk. The module may be incorporated in a tunable oscillator.

7 Claims, 6 Drawing Figures

METHOD OF FABRICATING A VARACTOR/OSCILLATOR DIODE MODULE FOR A TUNABLE OSCILLATOR

This invention relates to a method of fabrication of a module comprising an oscillating diode and a variable-capacitance diode, both diodes being of the solid-state type. The invention further relates to a tunable millimeter-wave oscillator comprising a diode module of this type.

U.S. Pat. No. 4,280,110 granted to the assignee of this application on July 21, 1981 disclosed a tunable millimeter-wave source of the type comprising a first module formed by a first diode which is capable of operating as an oscillating diode, a disk of solid dielectric surrounding said diode, a first electrode acting as a support and a metallization acting as a biasing electrode. The source further comprises a second module similarly formed by a second diode which is capable of operating as a variable-capacitance diode. A tunable transmitter can be constructed by means of two modules placed in top-to-tail relation in a waveguide section, the biasing electrodes being consequently located in very close proximity to each other. Suitable biasing is performed by separate means positioned within the waveguide section.

This system suffers from a disadvantage in that it calls for the use of two separate and distinct modules, with the result that positioning in the waveguide is complicated:

(a) in the first place from a geometrical and mechanical standpoint by reason of the need to provide two fixing means, one of which is displaceable in order to adjust the coupling of the two modules;

(b) in the second place by the fact that provision is made for two different bias voltages applied to two electrodes placed very close together.

The aim of this invention is to overcome the drawbacks noted in the foregoing.

The method according to the invention for the fabrication of a module comprising a first semiconductor diode capable of oscillating in millimeter waves and a second semiconductor diode of the variable-capacitance type essentially comprises at least the following steps during which:

(A) one of the diodes is mounted by welding its anode (or its cathode) on a first metallic base which performs the function of thermal radiator and of first electrode of the module, thus constituting a first subassembly;

(B) the other diode is mounted by welding its anode (or its cathode) on a second metallic base which performs the function of a second electrode of the module, thus constituting a second subassembly;

(C) each subassembly is equipped with a dielectric ring having a first flat face welded to the base, said ring being adapted to surround each diode so as to provide a second face parallel to the first plane face and which forms, together with the base surface delimited by the ring and with the internal walls of said ring, a cylinder which entirely contains each diode;

(D) flexible connections are bonded so as to connect the cathode (or anode) which has remained free in each diode to the second flat face of each ring;

(E) the two subassemblies mounted in top-to-tail relation with their flat faces bonded to the flexible connections are then welded to a third electrode of the module, said electrode being formed by a metallic disk.

Other features of the invention will be more apparent to those skilled in the art upon consideration of the following description and accompanying drawings, wherein.

Figure 1:
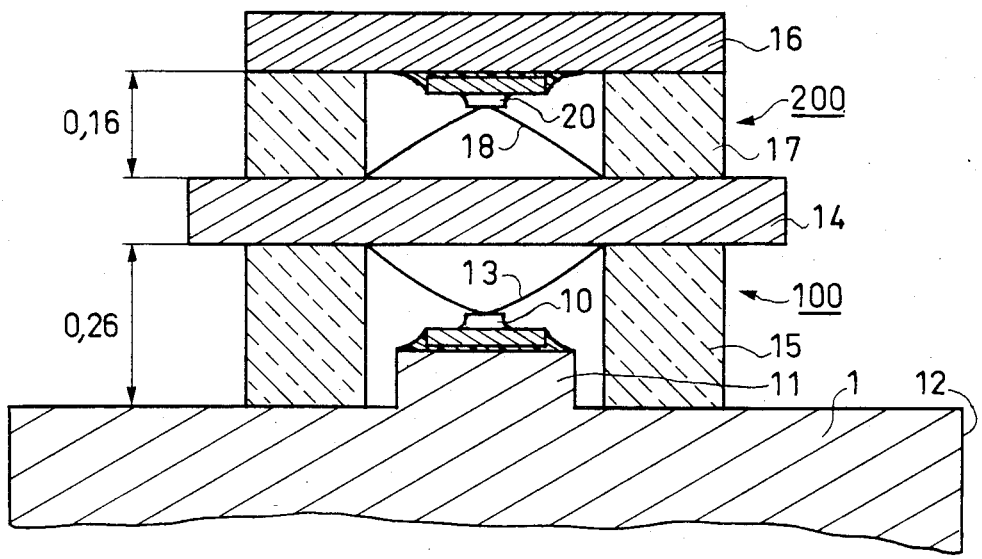
FIG. 1 is a diagrammatic sectional view showing one example of a module constructed by the method according to the invention.

The sectional view of FIG. 1 illustrates diagrammatically a portion of the first metallic support base 1 onto which a diode has been welded during the process step (A). By way of example, the diode 10 is intended to constitute the negative-resistance element of an oscillating circuit and consists of a semiconductor diode either of the Gunn type or of the avalanche type. The support base 1 has a central stud 11 and a cylindrical contour 12 which may be provided with a screw-thread if necessary.

One face of the diode 10 is welded to the stud 11 and the other face is bonded to a flexible connection 13. Said connection 13 is clamped and bonded between a metallic disk 14 and a ring 15 formed, for example, by a tube section of quartz-type glass (fused silica). On the opposite face of the disk 14 with respect to the face which is welded to the ring 15, provision is made for a second subassembly 200 which is welded in reverse on the disk 14, said disk being in turn welded to the first subassembly formed by the base 1, the ring 15 and the flexible connection 13.

The second subassembly 200 comprises a metallic support base 16 formed by a simple metallic disk without a central stud. The center of said base 16 supports the second diode 20 which is of the variable-capacitance type in the example chosen in the foregoing. Said second diode is surrounded by a ring 17 which is similar to the ring 15 but of smaller height owing to the absence of a central stud. A flexible connection 18 which is similar to the connection 13 is bonded to the free face of the diode 20 and clamped between the ring 17 and the disk 14.

The different steps of the fabrication process are described in detail below.

Figure 3:
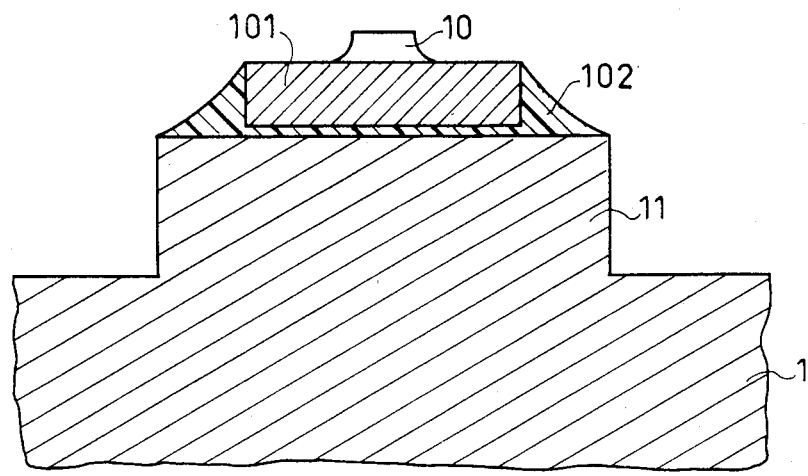
FIGS. 3 to 5 show different parts of the module at different stages of the fabrication process.

In a preliminary step, a silicon wafer in which diodes 10 have been formed is bonded collectively to a gold film 50 microns in thickness. "Bare chips" or in other words radiators 101 having dimensions of 200 microns on each side are then obtained by mesa etching and cutting, a mesa diode 10 being thus carried by each radiator as shown in FIG. 3.

Step (A) of the method is an operation which consists in welding the radiator 101 to the central stud 11 of the base 1 after preliminary interposition for example of a brazing preform 102 of gold-germanium alloy 25 microns in thickness. After welding, said preform is flattened as shown in the drawings (FIGS. 1 and 3).

Step (B) involves operation which are identical with those of step (A) in regard to the diode and the base. It is not necessary, however, to provide the diode 20 with a thermal radiator if it is of the variable-capacitance type since in this case the high-frequency energy developed in the semiconductor material is of relatively very low value.

The operations of step (C) simply consist, for example, in joining the rings 15 and 17 to their respective bases 1 and 16 by bonding or gold-tin brazing. By way of example, said rings have the following dimensions:
Internal diameter: 0.40 to 0.45 mm
External diameter: 0.75 to 0.80 mm
Height: 0.16 or 0.26 mm,
depending on whether consideration is given to the ring 17 or to the ring 15 by reason of the presence of the stud 11 which has a height of 0.1 mm in the case of the ring 15.

The flexible connections 13 and 18 which are necessary for step (D) are fabricated in accordance with the method described below.

Figure 4:
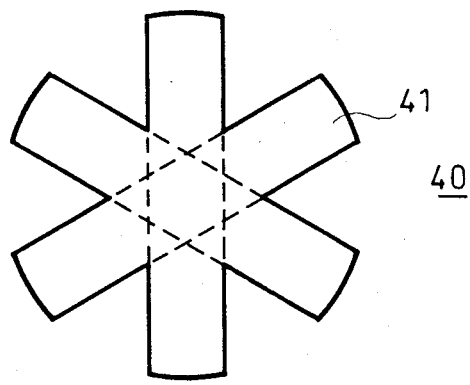

A star connector 40 having six arms 41 (as shown in FIG. 4) is cut out by the photoetching technique followed by chemical etching. The star connector is of copper having a thickness of 100 microns and covered by an electrolytic gold film. The diameter of the star connector is of the same order as the external diameter of the rings 15 and 17 with a margin which makes allowance for the difference in level of the faces to be connected.

Figure 5:
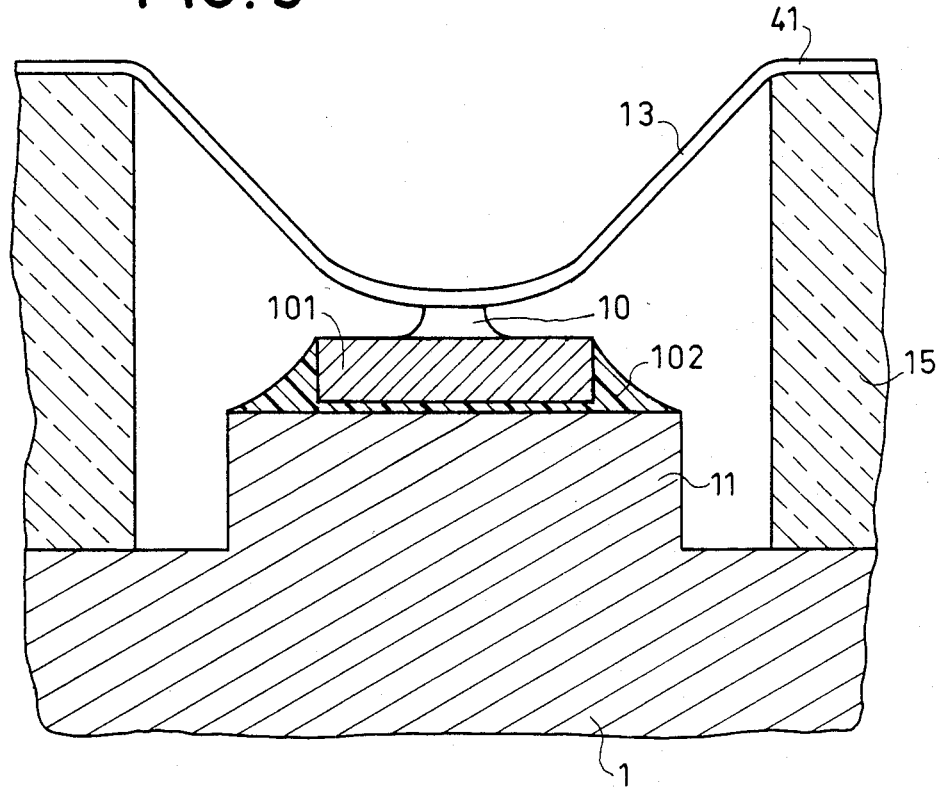

As shown in FIG. 5, the center of the star connector 40 is then welded to the electrode of the free face of the diode 10 (or 20) and the arms 41 are applied against the end face of the ring 15 (or 17), then bonded by thermocompression.

In step (E), the two subassemblies mounted in top-to-tail relation with their flat faces bonded to the connections 13 and 18 are then welded to a metallic disk formed of high-grade copper, for example, the diameter of said disk being chosen with a view to readily obtaining the requisite tuning frequency for the diode 10. This diameter is of the order of one millimeter.

Figure 2:
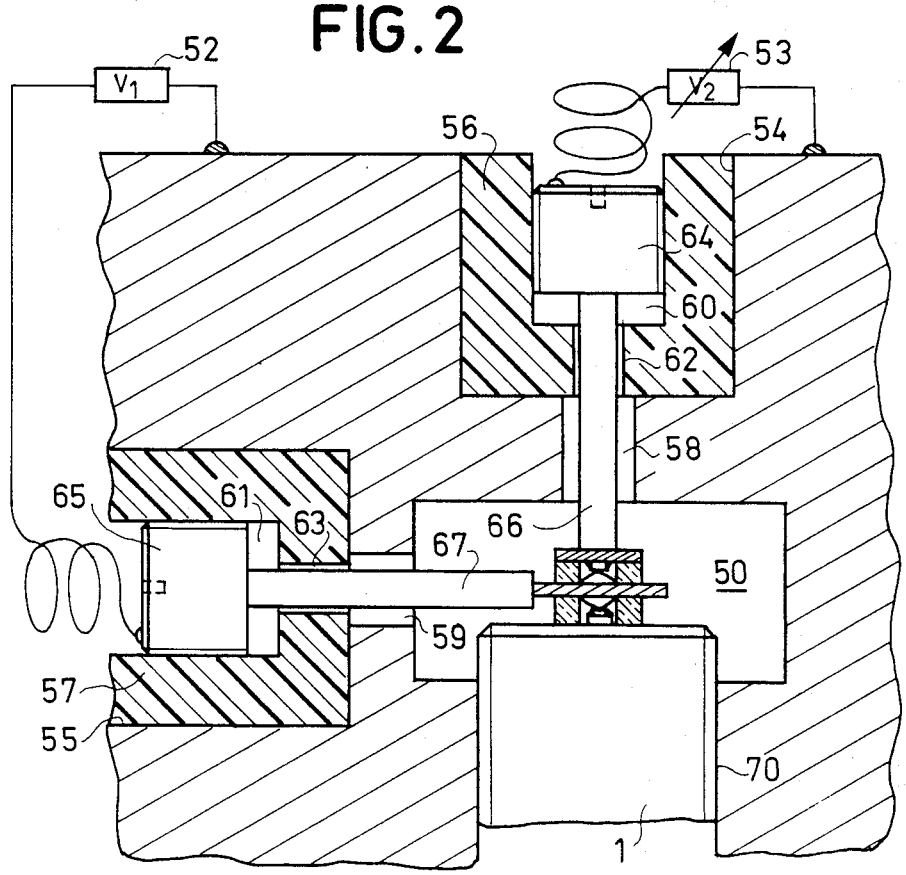
FIG. 2 is a diagrammatic sectional view showing part of a millimeter-wave oscillator which utilizes the module of FIG. 1.

FIG. 2 is a diagrammatic sectional representation of a cavity 50 forming part of a waveguide 51 which is shown in a partial sectional plan view at right angles to the longitudinal axis of the waveguide. Said waveguide as well as the supply and/or biasing voltage sources 52 and 53 constitute the components of a millimeter-wave oscillator.

The walls of the waveguide 51, the thickness of which is increased for this purpose at the level of the cavity 50, are provided with a first opening 70 on one long side of the cavity. The base 1 is displaceable in sliding motion within said opening in order to place the module which is welded to said base at the center of the cavity. The waveguide walls are also provided with cylindrical chambers 54 and 55 extending to the cavity 50 by means of openings 58 and 59 of smaller diameter. Said chambers are packed with insulating members 56 and 57 of resin filled with material which absorbs electromagnetic waves of very high frequency. Each insulating member in turn forms a chamber 60 (or 61) which extends to the opening 58 (or 59) by means of a passage 62 (or 63). Pistons 64, 65 of electrically conductive metal are slidably mounted within said chambers and extended by conductive rods 66 and 67 which can be placed in contact with the disks 16 and 14 respectively in order to bias these latter. If $V_1$ and $V_2$ are the d.c. bias voltages with respect to ground as supplied respectively by the sources 52 and 53, the bias voltages will be respectively $V_1$ in the case of diode 10 and $(V_2-V_1)$ in the case of diode 20.

Figure 6:
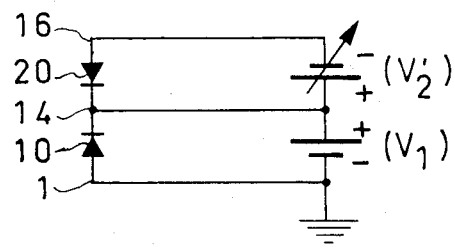
FIG. 6 shows a variant of the oscillator.

In a variant of the tunable oscillator shown in FIG. 6, the diode 10 is reverse-biased (avalanche diode) by a first source $V_1$ and the diode 20 is reverse-biased by a second source $V'_2$ connected between the ungrounded pole of the source $V_1$ and the disk 16 of the module connected to the diode 20.

The advantage of this variant arises from the fact that the voltage applied to the diode 10 (and consequently the transmitted power) is in this case made independent of the adjustment of the second source.

The invention applies in particular to oscillators in the 94–96 GHz frequency band. By way of example, it has been possible to obtain a power output of the order of 100 mW and a tuning range of 96 to 96.4 MHz.

What is claimed is:

1. A method of fabricating a module having an oscillator diode and a varactor diode mounted in series, said method comprising the steps of:
   (A) mounting one of the diodes by welding one of its anode and cathode on a first metallic base which performs the function of a thermal radiator and of a electrode of the module, and thus forming a first subassembly;
   (B) mounting the other diode by welding one of its anode and cathode on a second metallic base which performs the function of a second electrode of the module, and thus forming a second subassembly;
   (C) equipping each subassembly with a dielectric ring having a first flat face welded to the respective base, said ring surrounding the respective diode so as to provide a second flat face parallel to said first face and forming together with the base surface delimited by the ring and internal walls of said ring, a cylinder which entirely contains the respective diode;
   (D) bonding flexible connection so as to connect the other one of said anode and cathode which has remained free in each diode to the second flat face of the respective ring; and
   (E) mounting the two subassemblies so that the same face each other with their flat faces bonded to the flexible connections, and welding the same to a third electrode of the module, said third electrode being formed by a metallic disk having a diameter of a size so as to readily obtain oscillation of the oscillator diode at a predetermined frequency.

2. A fabrication method according to claim 1, including, prior to step (A), depositing a metallic later having the function of a thermal radiator on one of the electrodes of the oscillator diode.

3. A method according to claim 1 wherein, both in step (A) and in step (B), a brazing preform is interposed beforehand between the metallic base and the diode.

4. A method according to claim 1 wherein, in step (C), the rings are formed by tube sections of fused silica.

5. A method according to claim 1 wherein, in step (D), flexible connections are utilized in the form of sixarm star connectors.

6. A tunable oscillator incorporating a module comprising an oscillator diode and a varactor diode mounted in series, wherein the module comprises:
   one of said diodes having one of its anode and cathode welded on a first metallic base which performs the function of a thermal radiator,
   the other of said diodes having one of its anode and cathode welded on a second metallic base,
   a metallic disk placed between the two diodes, parallel to the first and second metallic base and connecting the two diodes in series with the help of flexible connections, two dielectric rings, each ring being placed between the metallic disk and one of the metallic bases in order to enclose the respective diode, said tunable oscillator comprising a cavity provided with three openings through which are introduced respectively the module with the help of its first metallic base, a first biasing rod placed in contact with the metallic disk, and a second biasing rod placed in contact with the second metallic base.

7. A tunable oscillator according to claim 6, wherein the first metallic base is connected to the ground formed by the cavity walls and wherein the biasing rods are isolated from the ground by elements of a material which absorbs electromagnetic waves.

* * * * *